United States Patent
Lee

(10) Patent No.: US 7,701,798 B2
(45) Date of Patent: Apr. 20, 2010

(54) POWER SUPPLY CIRCUIT FOR SENSE AMPLIFIER OF SEMICONDUCTOR MEMORY DEVICE

(75) Inventor: Kang Youl Lee, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 248 days.

(21) Appl. No.: 11/818,581

(22) Filed: Jun. 15, 2007

(65) Prior Publication Data

US 2008/0123457 A1   May 29, 2008

(30) Foreign Application Priority Data

Nov. 24, 2006   (KR) ...................... 10-2006-0117155

(51) Int. Cl.
*G11C 5/14* (2006.01)
(52) U.S. Cl. ...................... 365/226; 365/227; 365/228; 365/229; 365/222; 365/203; 365/205; 365/185.21; 365/185.25
(58) Field of Classification Search .................. 365/226, 365/227, 228, 229, 222, 203, 205, 185.21, 365/185.25
See application file for complete search history.

(56) References Cited

U.S. PATENT DOCUMENTS

| | | | | |
|---|---|---|---|---|
| 5,404,338 A | * | 4/1995 | Murai et al. | 365/189.05 |
| 6,385,115 B1 | | 5/2002 | Nakai | |
| 6,903,994 B1 | * | 6/2005 | Schoenfeld | 365/227 |
| 7,130,236 B2 | | 10/2006 | Rajwani et al. | |
| 2002/0147896 A1 | * | 10/2002 | Rentschler et al. | 711/167 |

FOREIGN PATENT DOCUMENTS

| | | |
|---|---|---|
| JP | 2002-251891 | 9/2002 |
| KR | 10-0173934 B1 | 11/1998 |
| KR | 10-2001-0029725 A | 4/2001 |
| KR | 10-2007-0036619 A | 4/2007 |

* cited by examiner

*Primary Examiner*—Van Thu Nguyen
*Assistant Examiner*—Eric Wendler
(74) *Attorney, Agent, or Firm*—John P. White; Cooper & Dunham LLP

(57) ABSTRACT

A power supply circuit for a sense amplifier of a semiconductor memory device includes a first reference voltage supplier configured to output a first reference voltage when a control signal is activated upon a write operation, a second reference voltage supplier configured to output a second reference voltage when the control signal is deactivated upon a read operation, and a core voltage source configured to receive the first reference voltage or the second reference voltage and generate a core voltage.

8 Claims, 4 Drawing Sheets

POWER SUPPLY CIRCUIT FOR SENSE AMPLIFIER OF SEMICONDUCTOR MEMORY DEVICE

CROSS-REFERENCES TO RELATED APPLICATIONS

The present application claims priority to Korean patent application number 10-2006-0117155, filed on Nov. 24, 2006, which is incorporated by reference in its entirety.

BACKGROUND OF THE INVENTION

The present invention relates to a semiconductor memory device, and more particularly to a power supply circuit for a sense amplifier of a semiconductor memory device.

Semiconductor memory devices, which are used for storage of information, have been advanced toward low costs, miniaturization, and large capacity, in accordance with the technical advances in computer system and electronic communication fields. In particular, the miniaturization of memory chips provides a technical basis for realizing the large capacity.

Generally, a semiconductor memory device such as a DRAM device includes cell blocks each consisting of a number of cells each of which includes one NMOS transistor and one capacitor and which are connected to word lines and bit lines connected in the form of a matrix.

Hereinafter, operation of such a general DRAM device will be described in brief.

When the DRAM device operates, the bit lines of one bit line pair, which have been precharged with a voltage corresponding to ½ of a core voltage Vcore in a standby mode before the operation of the DRAM device, are transited to voltages having a minute voltage difference, respectively, as they receive data from associated cells. When a sense amplifier operates in this state, the voltages of the bit lines, which have a minute difference, are varied to the core voltage Vcore and a ground voltage Vss, respectively. The data on each bit line amplified in the above-mentioned manner is transferred to a data bus line in response to an output signal from a column decoder.

Meanwhile, the time interval between a write command and a precharge command is called a "write recovery time" or "tWR". The write operation for memory cells should be completed within the write recovery time tWR. In conventional cases, however, there may be a phenomenon that it is impossible to fully pull up data storages to the level of the core voltage VCORE within the write recovery time tWR. This will be described with reference to FIGS. 1 and 2.

Referring to FIG. 1, a semiconductor memory device is illustrated. The semiconductor memory device includes word lines WL0 and WL1, memory cell arrays 120, 180 each including an array of NMOS transistors each connected, at a gate thereof, to an associated one of the word lines WL0 and WL1, and connected, at a drain thereof, to a capacitor, and switches 130, 170 for connecting the memory cell arrays 120, 180 to a sense amplifier 140. The sense amplifier 140, which is also included in the semiconductor memory device, includes PMOS transistors and NMOS transistors. The semiconductor memory device further includes a sense amplifier precharger 150, a YS switch 160 for connecting bit lines BLT0, BLB0 to data lines SIOT and SIOB, respectively, when a command such as a write command WT or a read command RD is input, and a core voltage source 110 for supplying a core voltage VCORE to the sense amplifier 140, as a CSP signal in response to SAP2 signal. SAP2 signal is activated as a high level to conduct a write or read operation. FIG. 2 is a timing diagram of the semiconductor memory device having the above-mentioned configuration.

In each memory cell array of FIG. 1, for example, the memory cell array 120, however, nodes SN0, SN1 thereof functioning as data storages have a relatively high resistance due to the characteristics of the used semiconductor memory fabrication process. Due to such a high resistance, there is a high possibility that the nodes SN0, SN1 cannot be fully pulled up to the VCORE level within a time interval from a write command to a precharge command, namely, the write recovery time tWR. In this case, the word lines may be closed in a state in which data of a level other than the VCORE level, namely, a level of "VCORE-Δ" has been stored in the nodes SN0, SN1. For this reason, there may be a problem of a degradation in the refresh efficiency of the memory cells.

BRIEF SUMMARY OF THE INVENTION

In one aspect of the present invention, a power supply circuit for a sense amplifier of a semiconductor memory device comprises: a control signal generator for generating a control signal which is activated upon a write operation; a multiplexer for selecting and outputting one of a first reference voltage and a second reference voltage input to the multiplexer, in response to the control signal; and a core voltage source for generating a core voltage in response to an output voltage from the multiplexer.

The control signal generator may generate, as the control signal, a signal for controlling the multiplexer to select the second reference voltage, when a write command signal is activated.

The second reference voltage may have a voltage level higher than the first reference voltage.

In another aspect of the present invention, a power supply circuit for a sense amplifier of a semiconductor memory device comprises a first reference voltage supplier for outputting a first reference voltage in response to an input control signal having write information, a second reference voltage supplier for outputting a second reference voltage in response to the control signal input to the second reference voltage, and a core voltage source connected to the first and second reference voltage suppliers.

The second reference voltage may have a voltage level higher than the first reference voltage.

The control signal may be activated upon a write operation.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Preferred embodiments of the present invention will now be described in detail with reference to the accompanying drawings.

The present invention provides a power supply circuit for a sense amplifier of a semiconductor memory device which is capable of storing data of an increased level in memory cells by applying a core voltage increased in level during a write recovery time, namely, a tWR time, and thus, achieving an improvement in refresh characteristics.

Figure 1:
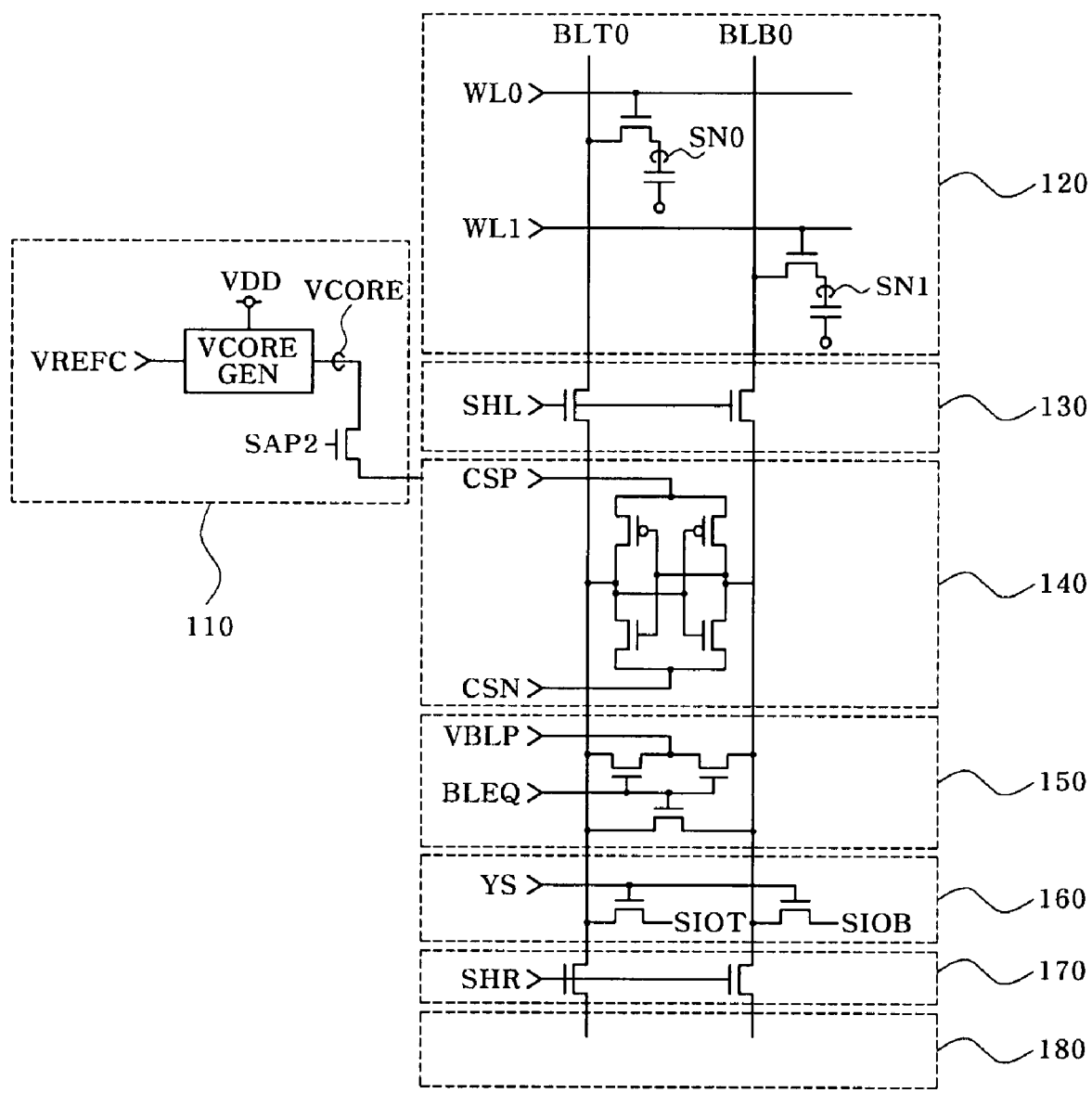
FIG. 1 is a circuit diagram illustrating a conventional semiconductor memory device.
Figure 2:
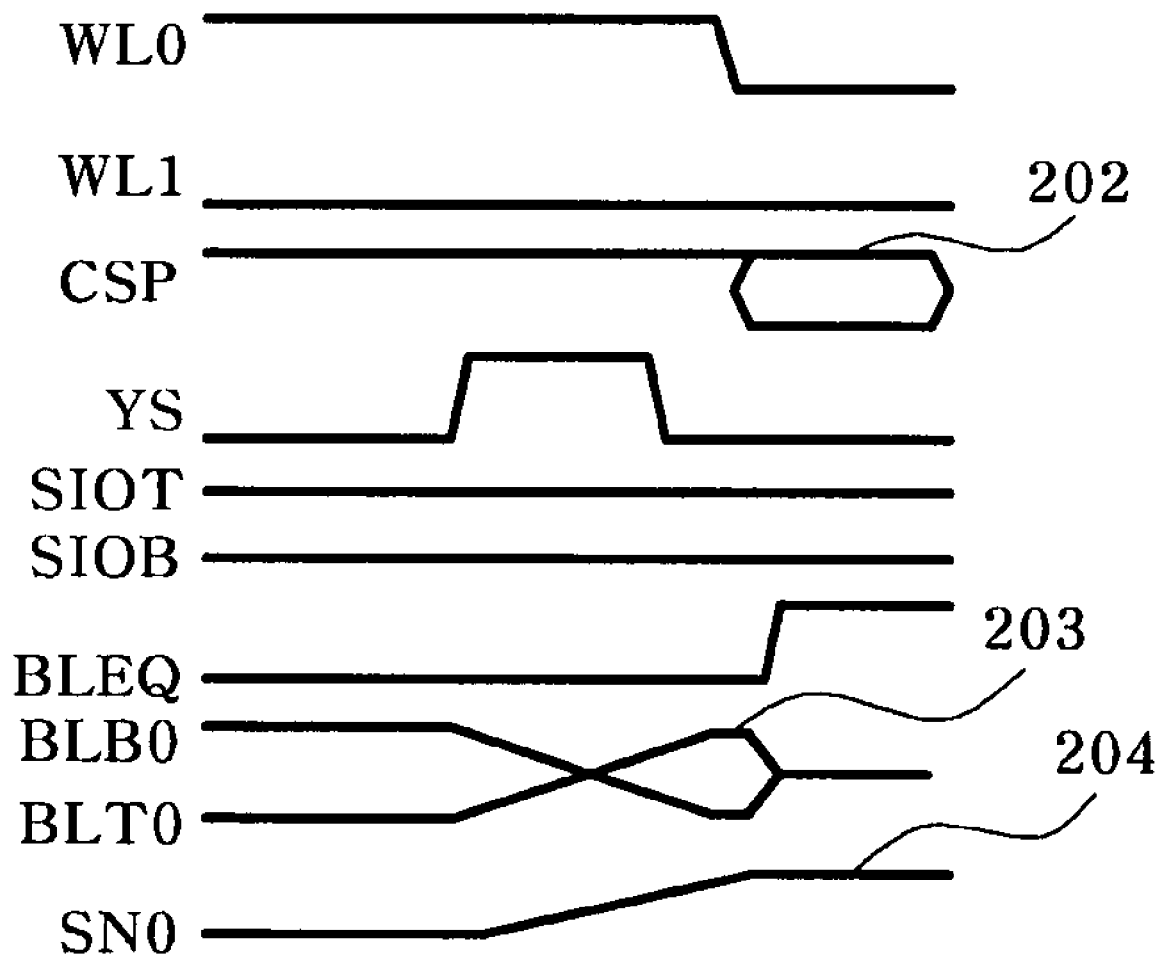
FIG. 2 is a timing diagram of the conventional semiconductor memory device.
Figure 3:
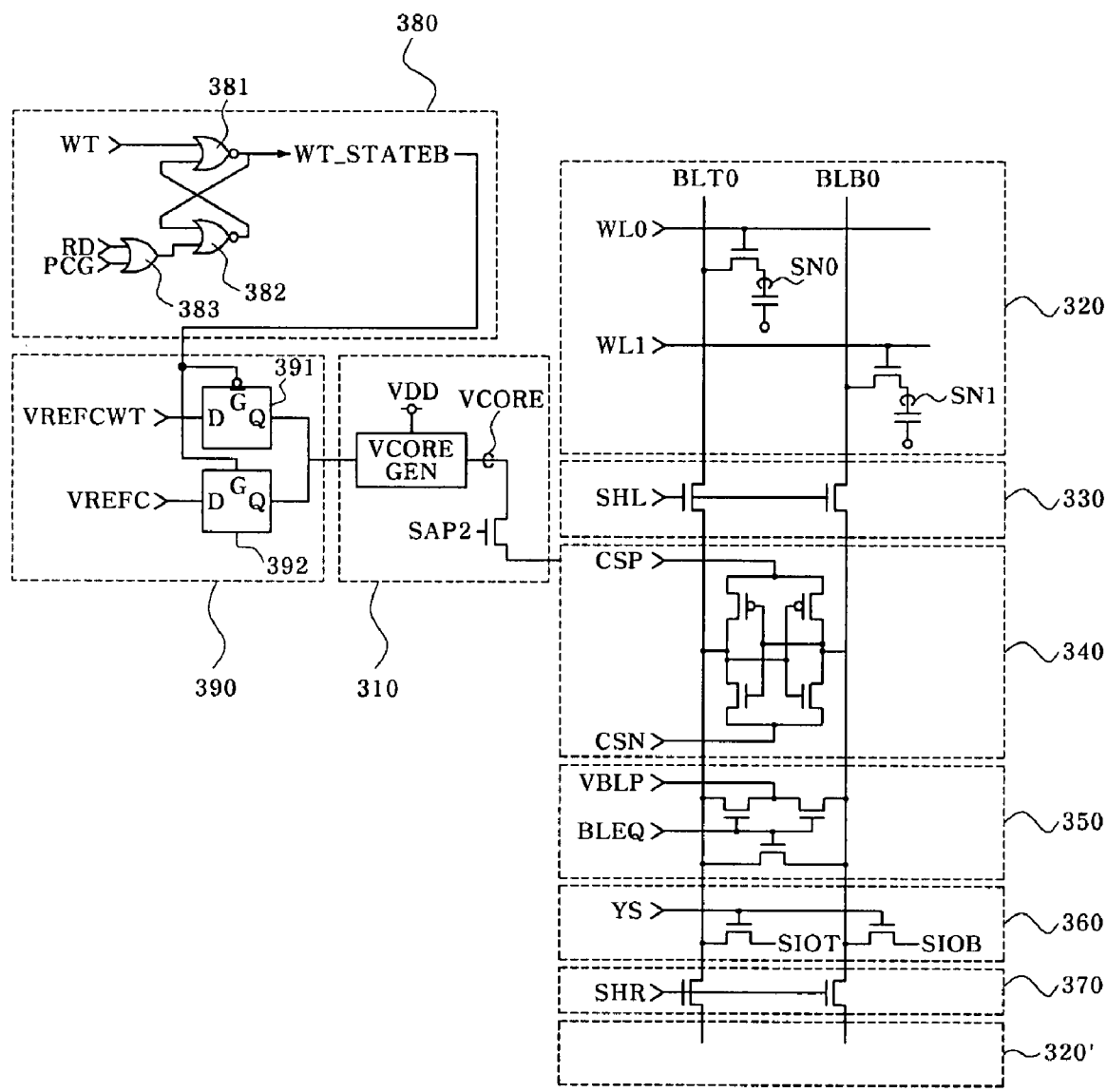
FIG. 3 is a circuit diagram illustrating a power supply circuit for a sense amplifier according to an exemplary embodiment of the present invention.
Figure 4:
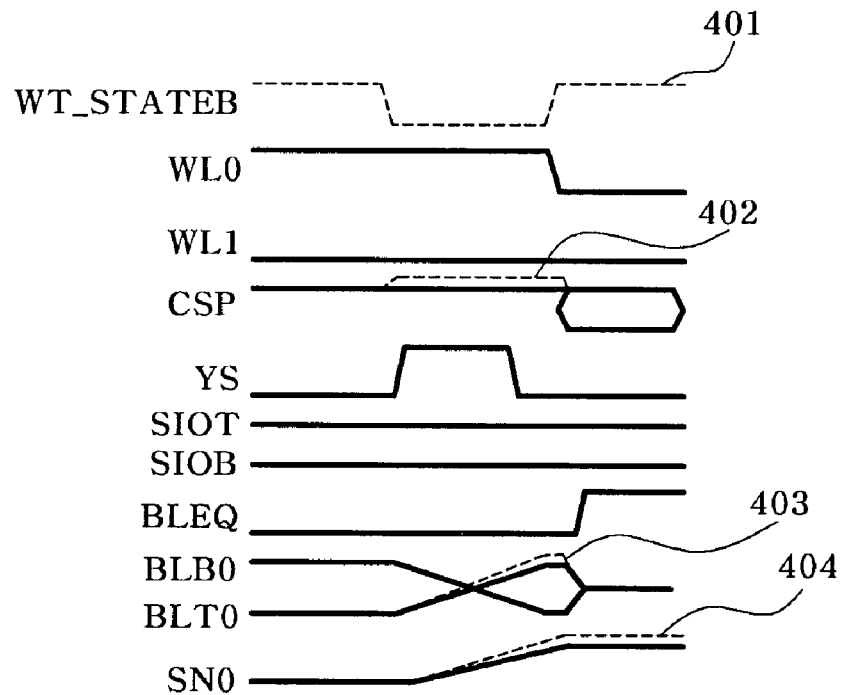
FIG. 4 is a timing diagram of a semiconductor memory device using the power supply circuit according to the illustrated embodiment of the present invention.

FIG. 3 is a circuit diagram illustrating a power supply circuit for a sense amplifier according to an exemplary embodiment of the present invention. FIG. 4 is a timing diagram of a semiconductor memory device using the power supply circuit according to the illustrated embodiment of the present invention.

As shown in FIG. 3, the power supply circuit includes a control signal generator 380 for generating a control signal WT_STATEB in response to a write command signal WT, a read command signal RD, and a precharge signal PCG, a multiplexer (MUX) 390 for selectively outputting one of first and second reference voltages VREFC and VREFCWT input to the multiplexer 390 in response to the control signal WT_STATEB, and a core voltage source 310 for generating a core voltage VCORE in response to an output voltage from the multiplexer 390. The second reference voltage VREFCWT has a voltage level higher than that of the first reference voltage VREFC.

When the write command signal WT is activated, the control signal generator 380 generates, as the control signal WT_STATEB, a control signal for selecting the second reference voltage VREFCWT. The control signal generator 380 includes a logic unit 383 for performing an ORing operation in response to the read command signal RD and precharge command signal PCG, and a latch for performing a latching operation in response to an output signal from the logic unit 383 and the write command signal WT, thereby outputting the control signal WT_STATEB. The latch includes an SR flip-flop circuit consisting of two NOR gates 381 and 382.

When the write command signal WT is activated, the MUX 390 selects and outputs the second reference voltage VREFCWT in response to the control signal WT_STATEB. The MUX 390 includes a first D flip-flop 392 for selecting and outputting the first reference voltage VREFC in response to the control signal WT_STATEB, and a second D flip-flop 391 for selecting and outputting the second reference voltage VREFCWT in response to the control signal WT_STATEB.

The core voltage source 310 generates the core voltage VCORE in response to the reference voltage signal VREFC or VREFCWT, and outputs the generated core voltage VCORE to the sense amplifier 340, as a CSP signal, in response to SAP2 signal. When the write command signal WT is activated, the core voltage source 310 generates the core voltage VCORE in response to the second reference voltage signal VREFCWT.

The semiconductor memory device includes word lines WL0 and WL1, memory cell arrays 320, 380 each including an array of NMOS transistors each connected, at a gate thereof, to an associated one of the word lines WL0 and WL1, and connected, at a drain thereof, to a capacitor, and switches 330, 370 for connecting the memory cell arrays 320, 380 to a sense amplifier 340. The sense amplifier 340, which is also included in the semiconductor memory device, includes PMOS transistors and NMOS transistors. The semiconductor memory device further includes a sense amplifier precharger 350, and a YS switch 360 for connecting bit lines BLT0, BLB0 to data lines SIOT and SIOB, respectively, when a command such as a write command WT or a read command RD is input. The core voltage source 310 supplies the core voltage VCORE to the sense amplifier 340, as a CSP signal.

Figure 5:
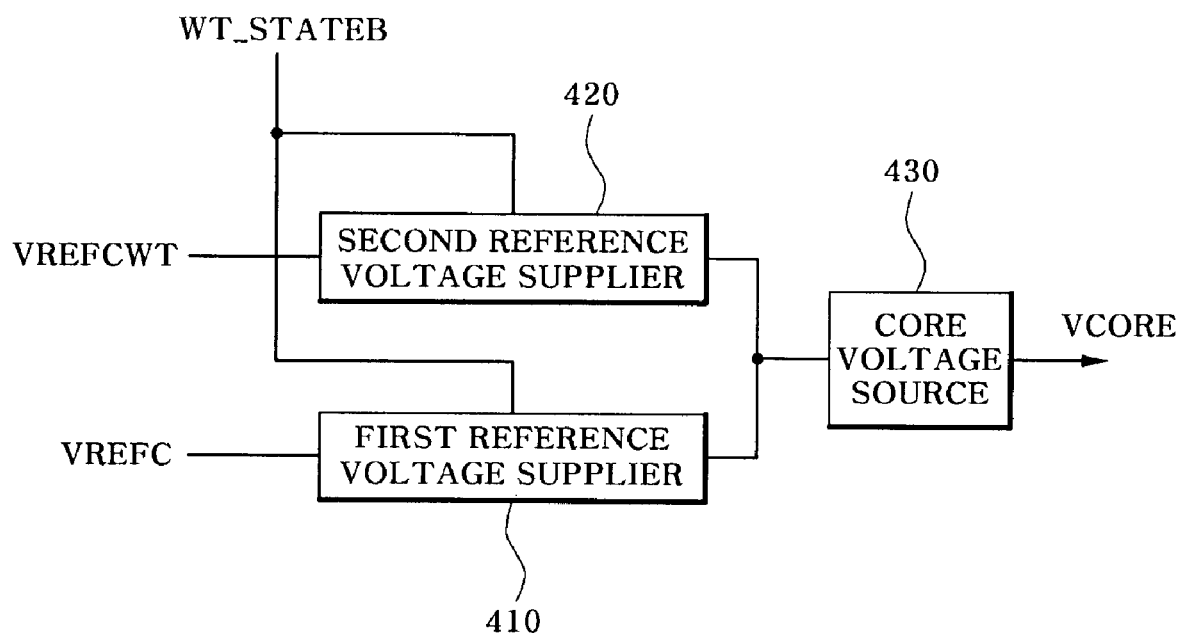
FIG. 5 is a circuit diagram illustrating a power supply circuit for a sense amplifier according to another exemplary embodiment of the present invention.

FIG. 5 is a circuit diagram illustrating a power supply circuit for a sense amplifier according to another exemplary embodiment of the present invention.

As shown in FIG. 5, the power supply circuit includes a first reference voltage supplier 410 for outputting a first reference voltage VREFC in response to a control signal WT_STATEB having write information, a second reference voltage supplier 420 for outputting a second reference voltage VREFCWT in response to the control signal WT_STATEB, and a core voltage source 430 connected to the first and second reference voltage suppliers 410 and 420.

The second reference voltage VREFCWT has a voltage level higher than that of the first reference voltage VREFC.

The control signal WT_STATEB is a signal which is activated during a write operation.

Operation of the power supply circuit having the above-described configuration according to this embodiment will be described with reference to FIGS. 3 and 4.

When a write command signal WT is activated, the control signal generator 380 outputs a signal having a low logic value "L" as the control signal WT_STATEB through the logic unit 383 operating in response to a read command signal RD and a precharge command signal PCG and the latch operating in response to an output signal from the logic unit 383 and the write command signal WT (401). As described above, the latch includes the NOR gates 381 and 382.

In response to the control signal WT_STATEB having a low logic value L output from the control signal generator 380, the MUX 390 then drives the second D flip-flop 391, to select, from the reference voltages input thereto, the second reference voltage VREFCWT, which has a higher voltage level, and outputs the selected second reference voltage VREFCWT.

Thereafter, the core voltage source 310 generates a core voltage VCORE in response to the second reference voltage signal VREFCWT output from the MUX 390, and applies the generated core voltage VCORE to the sense amplifier 340, as a CSP signal.

Meanwhile, a high-level pulse is applied to the YS switch 36 in accordance with the write command signal WT, so that data of opposite values are written on the bit lines BLB0 and BLT0, respectively. At this time, the CSP signal applied to the sense amplifier 340 boosts the voltage level of the signal on the bit line BLT0 when the bit line signal transits to a high logic value H (403). In addition, the CSP signal maintains the signal on the node SN0, namely, the signal passing through the NMOS transistor connected to the word line WL0, at a level slightly higher than that of the conventional case (404).

When the precharge command signal PCG is subsequently activated, the control signal generator 380 outputs a signal having a high logic value H through the logic unit 383 operating in response to the read command signal RD and precharge command signal PCG and the latch (381 and 382) operating in response to the output signal from the logic unit 383 and the write command signal WT (401).

In response to the control signal WT_STATEB having a high logic value H output from the control signal generator 380, the MUX 390 then drives the first D flip-flop 392, to select, from the reference voltages input thereto, the first reference voltage VREFC, and outputs the selected first reference voltage VREFC.

Thereafter, the core voltage source 310 generates a core voltage VCORE in response to the first reference voltage signal VREFC output from the MUX 390, and applies the generated core voltage VCORE to the sense amplifier 340, as a CSP signal. Since the control signal WT_STATEB is again transited to the high logic state H, and the first reference voltage VREFC is applied to the core voltage source 310, the core voltage VCORE is returned to a normal level.

As apparent from the above description, in accordance with the present invention, a core voltage VCORE having a slightly increased level is applied to the sense amplifier when the write command signal is activated, in order to increase the level of the node SN0. Accordingly, it is possible to record data having a higher logic value H on the capacitor of each memory cell within the tWR period, and thus, to improve the refresh characteristics of the semiconductor memory device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A power supply circuit for a sense amplifier of a semiconductor memory device comprising:
   a control signal generator configured to generate a control signal, the control signal being activated upon a write operation and deactivated upon a read operation or a precharge operation;
   a first reference voltage supplier configured to output a first reference voltage when the control signal is activated;
   a second reference voltage supplier configured to output a second reference voltage when the control signal is deactivated; and
   a core voltage source configured to receive the first reference voltage or the second reference voltage and generate a core voltage.

2. The power supply circuit according to claim 1, wherein the control signal generator comprises:
   a logic unit for performing an ORing operation in response to a read command signal and a precharge command signal; and
   a latch for generating the control signal in response to an output signal from the logic unit and the write command signal.

3. The power supply circuit according to claim 1, wherein the core voltage source receives the first reference voltage when the control signal is activated and receives the second reference voltage when the control signal is deactivated.

4. The power supply circuit according to claim 1, wherein the core voltage source outputs the core voltage to a sense amplifier in response to a signal being enabled to conduct a read or write operation.

5. The power supply circuit according to claim 1, wherein the first reference voltage has a voltage level higher than the second reference voltage.

6. The power supply circuit according to claim 2, wherein the latch comprises an SR flip-flop circuit.

7. A power supply circuit for a sense amplifier of a semiconductor memory device comprising:
   a first reference voltage supplier configured to output a first reference voltage when a control signal is activated upon a write operation;
   a second reference voltage supplier configured to output a second reference voltage when the control signal is deactivated upon a read operation or a precharge operation; and
   a core voltage source configured to receive the first reference voltage or the second reference voltage and generate a core voltage.

8. The power supply circuit according to claim 7, wherein the first reference voltage has a voltage level higher than the second reference voltage.

* * * * *